United States Patent

Miller

[11] Patent Number: 5,875,150
[45] Date of Patent: Feb. 23, 1999

[54] MICROPOWER READ-ONLY-MEMORY INTEGRATED CIRCUIT

[76] Inventor: Mark E. Miller, 403 Kilarney Way, Royersford, Pa. 19468

[21] Appl. No.: 908,844

[22] Filed: Aug. 8, 1997

[51] Int. Cl.⁶ .................................................. G11C 8/00
[52] U.S. Cl. .............................. 365/230.06; 365/185.23; 365/189.05
[58] Field of Search .................. 365/230.06, 185.23, 365/189.05

[56] References Cited

U.S. PATENT DOCUMENTS

| | | | |
|---|---|---|---|
| 5,402,382 | 3/1995 | Miyawaki et al. .................. | 365/185.23 |
| 5,446,700 | 8/1995 | Iwase .................................. | 365/230.06 |
| 5,715,203 | 2/1998 | Uchida ............................... | 365/230.06 |
| 5,719,818 | 2/1998 | Tovim et al. ....................... | 365/230.06 |

*Primary Examiner*—Son T. Dinh
*Attorney, Agent, or Firm*—Robert J. Black

[57] ABSTRACT

An integrated circuit read-only-memory with low power requirements, including a plurality of information storage memory cells and a decoder. The circuit operated in response to a selected address input and a control input to the decoder to direct and generate output of information stored in a selected one of the memory cells.

8 Claims, 5 Drawing Sheets

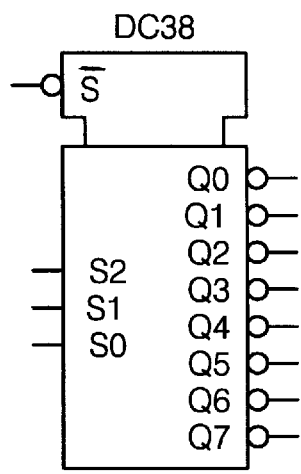
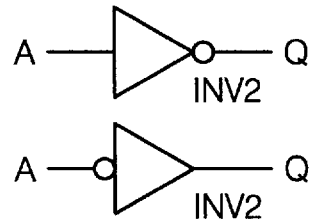
Fig.6
Fig.7
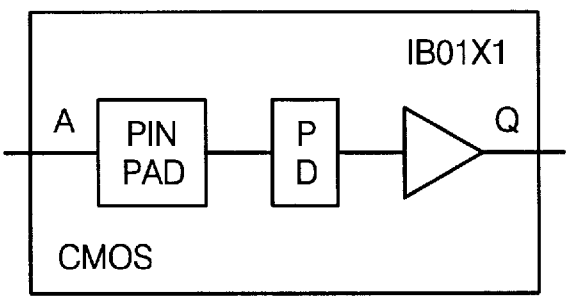
Fig.8
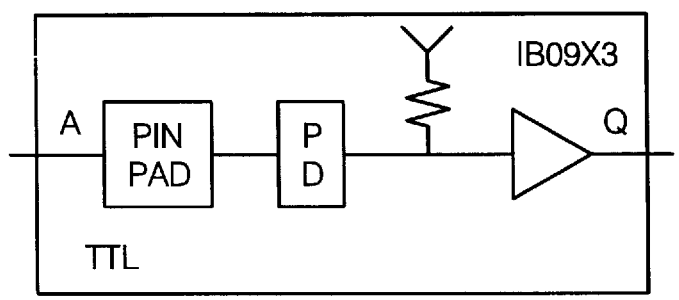
Fig.9

Fig. 10

| FUNCTION BLOCK NAME | DESCRIPTION | STATIC POWER @3.15V (uW) | STATIC POWER @4.3V (uW) | TOGGLE FREQ. (MHz) | EQUIVALENT LOADS | DYNAMIC POWER @3.15V (uW) | DYNAMIC POWER @4.3V (uW) | QUANTITY | TOTAL POWER @3.15V (uW) | TOTAL POWER @4.3V (uW) |
|---|---|---|---|---|---|---|---|---|---|---|
| R06cwxyz | 512 X 8 ROM CELL | 1.62 | 2.21 | .00175 | 629 | .546 | 1.02 | 64 | 139 | 207 |
| DC38 | 3:8 DECODER (FIRST LEVEL) | .0820 | .112 | .112 | 52 | 2.89 | 5.38 | 1 | 2.97 | 5.50 |
| DC38 | 3:8 DECODER (SECOND LEVEL) | .0820 | .112 | .0140 | 52 | .361 | .673 | 8 | 3.54 | 6.28 |
| INV2 | INVERTER | .0063 | .0086 | .00175 | 3 | .00260 | .00485 | 64 | .570 | .861 |
| IB01X1 | INPUT PAD, CONTROL | .0879 | .120 | .112 | 158 | 8.78 | 16.4 | 2 | 17.7 | 33.0 |
| IB01X1 | INPUT PAD, A0 | .0879 | .120 | .0560 | 158 | 4.39 | 8.18 | 1 | 4.48 | 8.30 |
| IB01X1 | INPUT PAD, A1 | .0879 | .120 | .0280 | 158 | 2.19 | 4.09 | 1 | 2.28 | 4.21 |
| IB01X1 | INPUT PAD, A2 | .0879 | .120 | .0140 | 158 | 1.10 | 2.05 | 1 | 1.19 | 2.17 |
| IB01X1 | INPUT PAD, A3 | .0879 | .120 | .00700 | 158 | .549 | 1.02 | 1 | .637 | 1.14 |
| IB01X1 | INPUT PAD, A4 | .0879 | .120 | .00350 | 158 | .274 | .511 | 1 | .362 | .631 |
| IB01X1 | INPUT PAD, A5 | .0879 | .120 | .00175 | 158 | .137 | .256 | 1 | .225 | .376 |
| IB01X1 | INPUT PAD, A6 | .0879 | .120 | .00087 | 158 | .069 | .128 | 1 | .157 | .248 |
| IB01X1 | INPUT PAD, A7 | .0879 | .120 | .00044 | 158 | .034 | .064 | 1 | .122 | .184 |
| IB01X1 | INPUT PAD, A8 | .0879 | .120 | .00022 | 158 | .017 | .032 | 1 | .105 | .152 |
| IB01X1 | INPUT PAD, A9 | .0879 | .120 | .00011 | 158 | .009 | .016 | 1 | .097 | .136 |
| IB01X1 | INPUT PAD, A10 | .0879 | .120 | .00005 | 158 | .004 | .008 | 1 | .092 | .128 |
| IB01X1 | INPUT PAD, A11 | .0879 | .120 | .00003 | 158 | .002 | .004 | 1 | .090 | .124 |
| IB01X1 | INPUT PAD, A12 | .0879 | .120 | .00002 | 158 | .001 | .002 | 1 | .089 | .122 |
| IB01X1 | INPUT PAD, A13 | .0879 | .120 | .00001 | 158 | .001 | .001 | 1 | .089 | .121 |
| IB01X1 | INPUT PAD, A14 | .0879 | .120 | 0 | 158 | 0 | 0 | 1 | .088 | .120 |
| IB09X3 | TRI-STATE OUTPUT PAD | .0945 | .129 | .112 | 177 | 9.83 | 18.3 | 8 | 79.4 | 147 |
| TOTALS | | | | | | | | | 253 | 418 |

MICROPOWER READ-ONLY-MEMORY INTEGRATED CIRCUIT

BACKGROUND OF THE INVENTION

1. FIELD OF THE INVENTION

The present invention relates to integrated circuits. More particularly, the present invention relates to a family of micropower masked read-only-memory integrated circuits.

2. BACKGROUND ART

The present invention is similar in form and function to commercially available masked read-only-memories, except for the provision of extremely lower level of power consumption. At the present time, many low-power components found in existing product lines are being made obsolete by vendors at an alarming rate. This action results in the substitution of functionally equivalent but much higher power requirement parts. Since the transmitter's maximum power consumption is a fixed value, the necessary power levels must be obtained by reducing the power consumption of other devices or by major architectural changes. Consequently, a read-only-memory requiring only ultra-low power consumption would provide an attractive alternative to the user.

A significant number of read-only-memory masked integrated circuits are available from a wide variety of domestic and international vendors. Information pertaining to and describing these devices can be found primarily in the associated data books provided by the vendors. Detailed power consumption data for some of these devices has been reviewed and the tabulation has resulted in the development of the present design for a low-power integrated circuit. It has been noted that the commercially available masked read-only-memories as presently utilized in the prior art utilize a single memory array to achieve high speed and maximum bit density.

SUMMARY OF THE INVENTION

The present invention achieves the above objects features by focusing primarily on minimum power consumption by splitting the memory array into a matrix of smaller cells enabling only the cell that actually contains the desired data during the read access. By utilization of this architecture in conjunction with a small amount of supporting logic gate circuitry, extremely low power consumption is achieved.

The concept involved in the design of the present read-only-memories employs a relatively simple technique. Instead of the utilization of a single, large array of read-only-memory bits, the present invention subdivides the large array into a set of smaller memory cells. This particular technique provides significantly lower power consumption because only that single cell that holds the desired information is turned on during any one particular access cycle.

In the design based on the present invention, the total memory capacity is equally divided into a number of smaller memory cells. The lower order physical address is fed through to each cell and an upper order physical address is decoded to determine which cell is selected. Utilization of control signals determines the timing of the cell's strobe. The input buffers provide isolation for all device input and the output buffers provide the necessary drive levels to operate in a typical system environment. The decoding circuitry employs a simple 3:8 decoder logic block. Depending on the actual number of the memory cells and size of each cell, the decoding circuit might be more or less complex than the representative circuitry employed in the initial design of the present invention.

As noted, the interface based on timing can be implemented in a number of ways depending upon the application arrangements with little or no effect on the overall power consumption of the device. Timing as used herein represents the most common type of bus interface utilized within transmitters as employed by the assignee of the present invention. Actual access times, of course, are implementation- and technology-dependent, but access times in the order of 10 nanoseconds can be easily obtained utilizing the present architecture.

As will be demonstrated in the present application, power consumption of a typical micropower read-only-memory employing the techniques developed herein will be shown. It has been noted that specifically a typically device used in low-power applications by the assignee requires a 32K×8 (256 kilobits) in a system that is running at 895 kilohertz and 4.3 volts. Utilizing calculations performed with a 3.15 volt source, the results indicate that the power consumption level of the micropower read-only-memory would be about 253 microwatts vs. 6552 microwatts for commercially available devices, such as that produced by Atmel as their model AT27LVO10-20J1. This translates to something like a 25:1 reduction in power consumption.

Experience has indicated that the calculated power consumption values utilizing standard cell process are approximately 30% higher than the actual measured power consumption values of existing devices. Thus, it can be concluded that the reduction in power consumption actually may prove to be even larger. In addition, power consumption levels of the micropower read-only-memories in accordance with the present invention are largely independent of the amount of memory within the device. More specifically, it has been concluded that increasing the amount of memory in the device by 100% (to 512K×8) would only increase power consumption by about 40%.

The micropower read-only-memory architecture as described in the present invention provides a high degree of flexibility in terms of performance of characteristics. Any word size (e.g., 4-, 8-, 9-, 16-bit words), any overall memory size (in increments of 512 bytes), and any operating voltage in the range of 2.7 volts to 5.5 volts can be accommodated. In addition, operating speeds from 0 to 100 megahertz and operating temperatures from −40° C. to 93° C. are obtainable.

BRIEF DESCRIPTION OF THE DRAWINGS

Preferred embodiments of the present invention will be described in detail with reference to the accompanying drawings wherein:

FIGS. 5, 6, 7, 8, and 9 show the logic symbols for components as used in the present invention.

FIG. 10 shows power consumption calculations of a typical implementation of the present invention.

DETAILED DESCRIPTION OF THE PREFERRED EMBODIMENT

Figure 1:
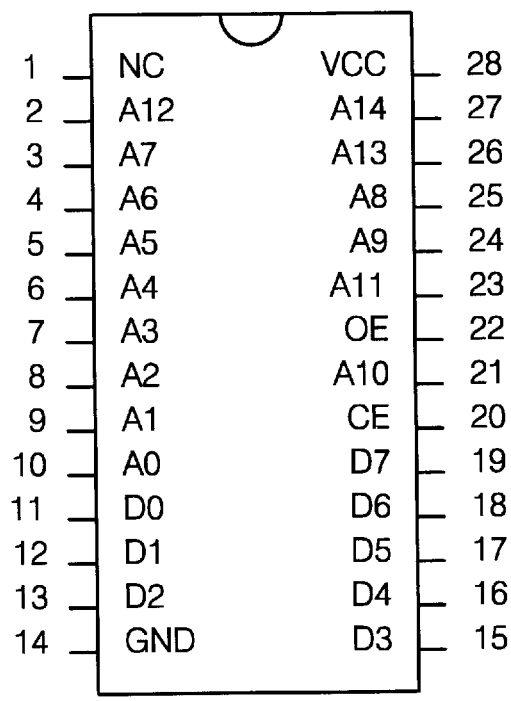
FIG. 1 is a possible pin diagram of the integrated circuit in accordance with the teachings of the present invention.

Referring first to FIG. 1, integrated circuitry in accordance with the present invention can be implemented in any number of different configurations or packaging techniques as desired. However, it has been determined that for at least certain product applications a standard 27256 pinout and package would provide the best alternative. Details of the possible pin diagram are shown in FIG. 1 which would provide the pinout for integrated circuitry in accordance with the teachings of the present invention.

Figure 2:
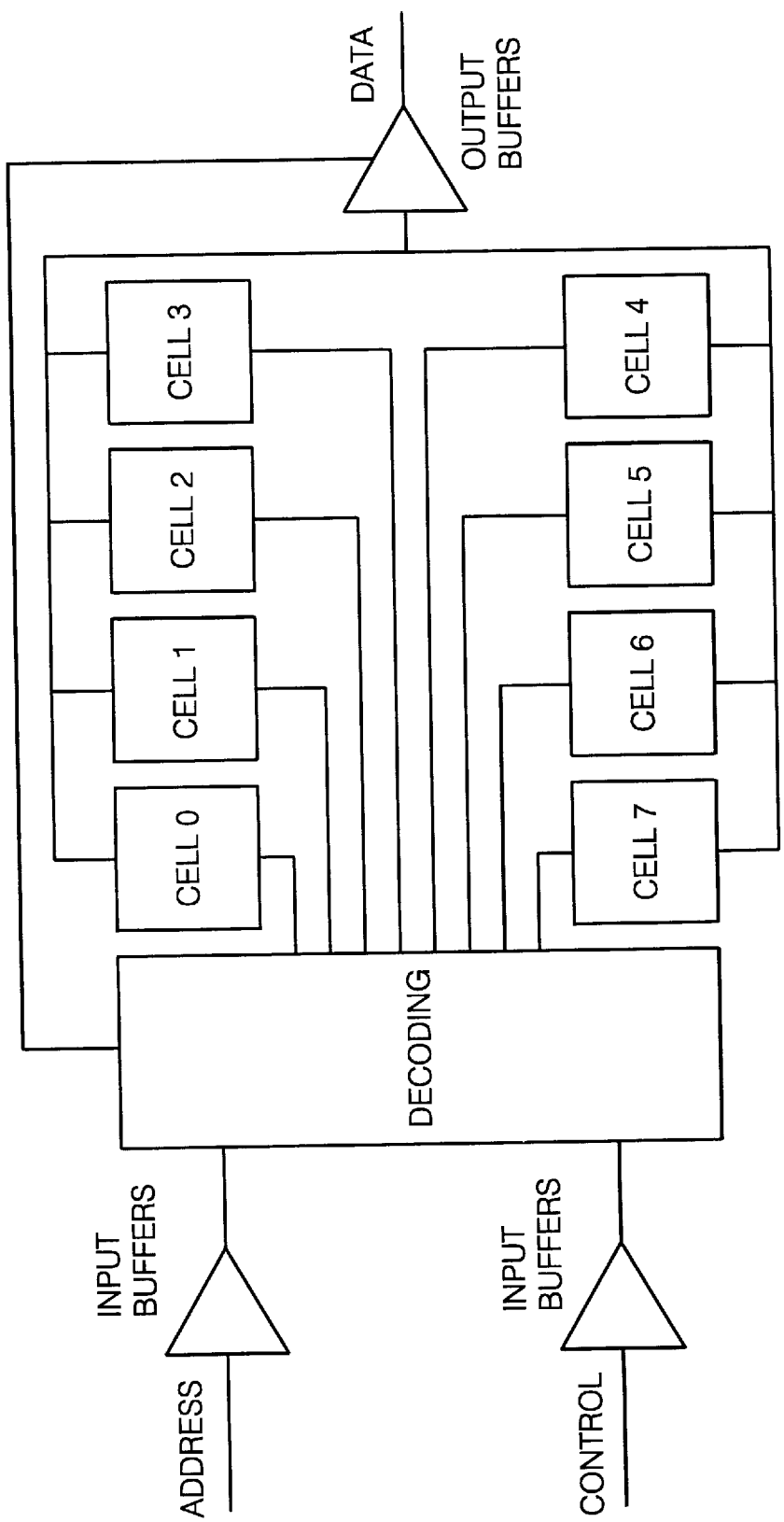
FIG. 2 is a functional block diagram of a representative micropower read-only-memory device in accordance with the teachings of the present invention.
Figure 4:
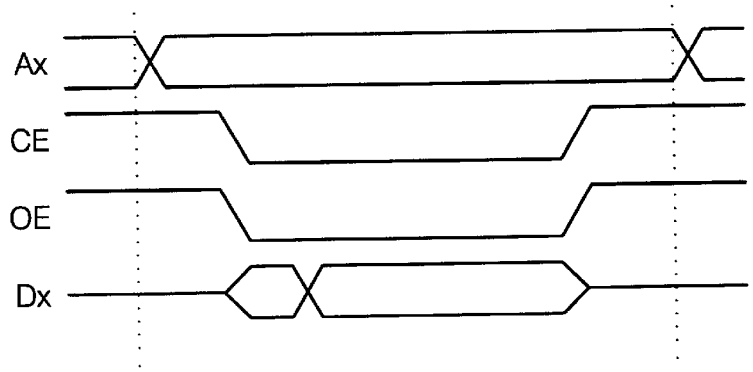
FIG. 4 is a timing diagram showing an example of one method for implementing the bus interface of a family of devices in accordance with the teachings of the present invention.

Referring now to FIG. 2, a functional block diagram of a representative low-power read-only-memory device is shown. Total memory capacity is equally subdivided into a number of smaller memory cells (cells 0 to 7). A lower order address is fed through to each cell and an upper order address is decoded to determine which cell is selected. Control signals determine the timing of the cell's strobe which is indicated in FIG. 4. The input buffers provide isolation for all device inputs and the output buffers provide the necessary drive levels to operate in a typical system environment.

Figure 3:
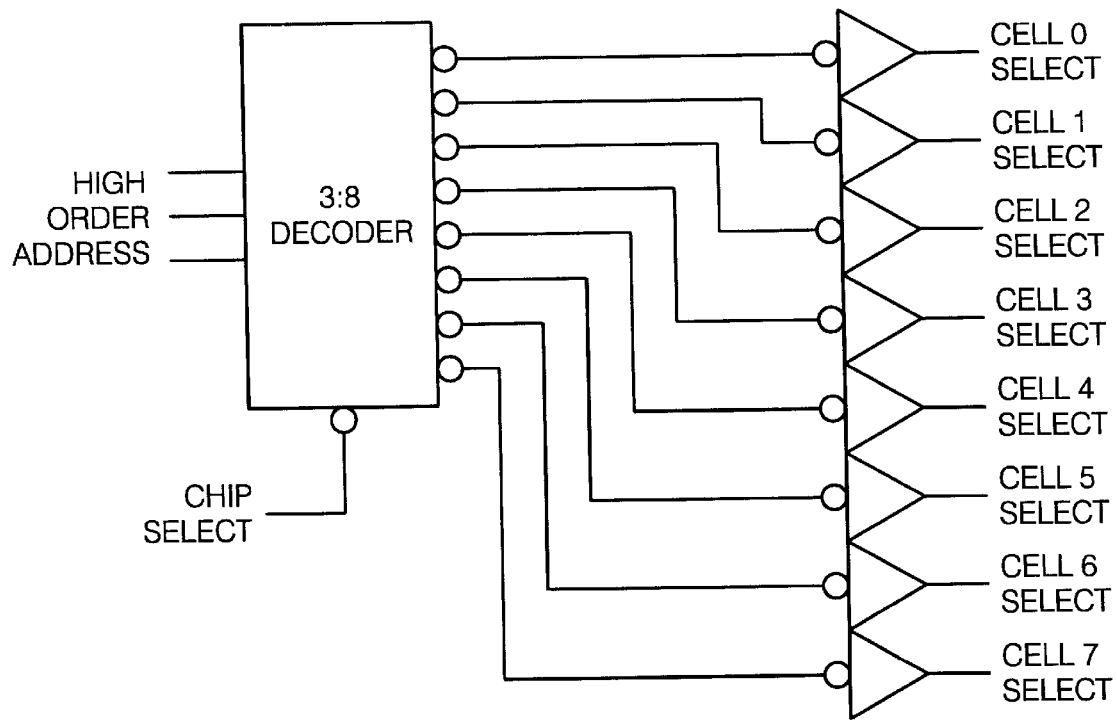
FIG. 3 is a functional block diagram of the typical decoding circuit as employed in the present invention.

Details of the decoder circuit, which is a 3:8 decoder, are shown in FIG. 3. Depending on the actual number of memory cells and the size of each cell, the decoding circuit may be more or less complex than the representative circuit shown. The components utilized in the present invention utilize a number of components as available through American Microsystems, Inc. The specific numbers and implementation are shown in FIG. 10, where, for example, the read-only-memory cells are American Microsystems, Inc. units Ro6cwxyz.

These units are 0.8 micron read-only-memories that operate within a power supply voltage range of 4.5 to 5.5 volts. The unit described has a three-state output with an active low output enable (OEN) circuit, precharged when the chip select (CS) line is low. Read operation occurs when CS is high. Output becomes valid a short time after the rising edge of CS and stays valid until the next rising edge of CS.

Figure 5:
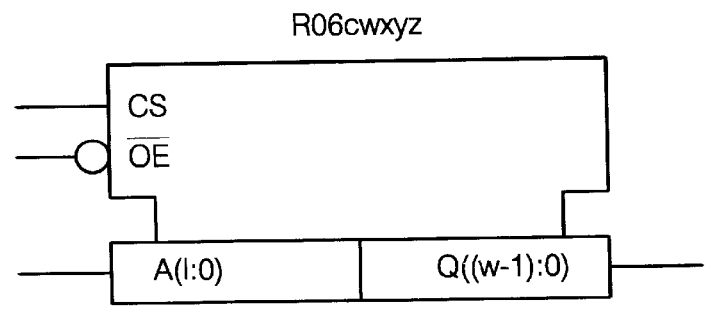

The logic symbol for the read-only-memory cells is shown in FIG. 5.

The decoding circuitry shown in FIG. 3, and generally in block form in FIG. 2, employs American Microsystem, Inc. DC38 decoder which is a 3:8 line decoder/demultiplexer with an active low enable. The logic symbol is shown in FIG. 6. The inverter utilized with each cell is American Microsystems, Inc. circuit INV2 which is a simple inverter which performs the logical NOT function. The circuitry for the logic circuitry is shown as FIG. 7.

The input pads utilized in connection with the present invention are American Microsystems, Inc. IBO1X1, which is utilized as a noninverting CMOS level input buffer pad. The logic symbol is shown in FIG. 8.

A tri-state output pad as utilized in the present invention employs an American Microsystems, Inc. unit IBO9X3, which is a noninverting TTL-level input buffer pad with pullup. Logic circuitry for one-state which unit is shown as FIG. 9.

Referring now to FIG. 4, which is the timing diagram for the bus interface, interface can be implemented in a number of ways depending upon application requirements with little or no effect on the overall power consumption of the device. This timing diagram represents the most common type of bus interface used within any current transmitters. In addition, actual access times would be implementation- and technology-dependent, but access times on the order of 10 nanoseconds can be easily obtained utilizing the present micropower architecture.

Referring now to power consumption calculations as shown in FIG. 10, it can be seen by implementation of the present invention utilizing the component circuitry and the arrangement described herein that the total power consumption with a 3.15 volt power supply has a total of only 253 microwatts, while utilization with a 4.3 volt power source would utilize only 418 microwatts of power. Thus, it can be concluded that the power-conserving techniques described herein are substantial better than presently manufactured units which might use over 6,000 microwatts for one of the lowest power-consuming commercially-available units, such as the Atmel AT27LVO10-20J1.

It will be obvious from the foregoing that by splitting the memory array into a matrix of smaller cells and only enabling that cell that actually contains the desired data during the read access, substantial power consumption is achieved. The arrangement described in conjunction with the requirement for only a small amount of supporting logic gates provides this desirable effect.

While but a single embodiment of the present invention has been shown, it will be obvious to those skilled in the art that numerous modifications can be made without departing from the spirit of the present invention, which shall be limited only by the scope of the claims appended hereto.

What is claimed is:

1. An integrated circuit read-only-memory operable with low power requirements, said circuit comprising:

a first decoder means including a plurality of input circuits connected through a plurality of address input buffers to a plurality of address input circuits and a control input circuit connected through a control input buffer and connected through said first decoder means to a plurality of integrated circuit units each including;

a plurality of information storage memory cells;

second decoder means including a plurality of output circuits, a plurality of address input circuits, and an input control circuit;

a plurality of inverter means each connected between one of said second decoder means and one of said memory cells;

a plurality of address input circuits each connected from said first decoder means through an address input buffer to one of said second decoder means address input circuits;

a control input circuit connected from said first decoder means through a control input buffer to said address second decoder means input circuit;

an output buffer including an input circuit from each of said memory cells, a control circuit from said second decoder means, and an output circuit;

said integrated circuit operated in response to a selected address input and a control input to said first decoder means to direct and generate output of information stored in a selected one of said memory cells at said output of said output buffer.

2. An integrated circuit as claimed in claim 1 wherein:

said plurality of information storage memory cells each comprise a memory chip having a buffered or three-state output.

3. An integrated circuit as claimed in claim 1 wherein:

each of said inverter means connected between one of said second decoder means and one of said memory cells, each comprise an inverter which performs a logical NOT function.

4. An integrated circuit as claimed in claim 1 wherein:

said address input buffers each comprise a non-inverting CMOS level input buffer pad.

5. An integrated circuit as claimed in claim 1 wherein:

said control input buffer comprises a non-inverting CMOS level input buffer pad.

6. An integrated circuit as claimed in claim 1 wherein:

said output buffer comprises a non-inverting TTL-level input buffer pad with pull-up.

7. An integrated circuit as claimed in claim 1 wherein:

said first decoder means comprise a 3:8 line decoder demultiplexer with an active low enable.

8. An integrated circuit as claimed in claim 1 wherein:

said second decoder means comprise a 3:8 line decoder demultiplexer with an active low enable.

\* \* \* \* \*